(12) United States Patent
Kanatzidis et al.

(10) Patent No.: US 11,508,865 B2
(45) Date of Patent: Nov. 22, 2022

(54) COPPER HALIDE CHALCOGENIDE SEMICONDUCTOR COMPOUNDS FOR PHOTONIC DEVICES

(71) Applicant: Northwestern University, Evanston, IL (US)

(72) Inventors: Mercouri G. Kanatzidis, Wilmette, IL (US); Wenwen Lin, Evanston, IL (US)

(73) Assignee: Northwestern University, Evanston, IL (US)

( * ) Notice: Subject to any disclaimer, the term of this patent is extended or adjusted under 35 U.S.C. 154(b) by 310 days.

(21) Appl. No.: 16/627,894

(22) PCT Filed: Jul. 16, 2018

(86) PCT No.: PCT/US2018/042251
§ 371 (c)(1),
(2) Date: Dec. 31, 2019

(87) PCT Pub. No.: WO2019/018268
PCT Pub. Date: Jan. 24, 2019

(65) Prior Publication Data
US 2020/0365753 A1 Nov. 19, 2020

Related U.S. Application Data

(60) Provisional application No. 62/533,289, filed on Jul. 17, 2017.

(51) Int. Cl.
*H01L 31/08* (2006.01)
*G01T 1/24* (2006.01)
(Continued)

(52) U.S. Cl.
CPC ............ *H01L 31/085* (2013.01); *G01T 1/241* (2013.01); *H01L 31/032* (2013.01); *H01L 31/072* (2013.01)

(58) Field of Classification Search
CPC ... H01L 31/085; H01L 31/032; H01L 31/072; G01T 1/241
See application file for complete search history.

(56) References Cited

U.S. PATENT DOCUMENTS 4,060,672 A * 11/1977 Alpen ..................... H01M 8/10
429/304
6,312,617 B1  11/2001 Kanatzidis et al.
(Continued)

FOREIGN PATENT DOCUMENTS

WO   WO 2018/017909 A2   1/2018

OTHER PUBLICATIONS

Pfitzner, Arno et al., "TeS2 Radical Anions in CuBrCu1.2TeS2", Angew. Chem. Int. Ed. 1998, 37, No. 13/14, pp. 1955-1957. (Year: 1998).*

(Continued)

*Primary Examiner* — Tamir Ayad
(74) *Attorney, Agent, or Firm* — Bell & Manning, LLC

(57) ABSTRACT

A semiconductor material having the molecular formula Cu2I2Se6 is provided. Also provided are solid solutions of semiconductor materials having the formulas Cu2IxBr2-xSeyTe6-y and Cu2IxBr2-xSeyS6-y, where $0 \leq x \leq 1$ and $0 \leq y \leq 3$. Methods and devices that use the semiconductor materials to convert incident radiation into an electric signal are also provided. The devices include optoelectronic and photonic devices, such as photodetectors, photodiodes, and photovoltaic cells.

14 Claims, 7 Drawing Sheets

(51) Int. Cl.
  *H01L 31/032* (2006.01)
  *H01L 31/072* (2012.01)

(56) References Cited

U.S. PATENT DOCUMENTS

2012/0153178 A1   6/2012   Kanatzidis et al.
2015/0295194 A1   10/2015  Kanatzidis et al.

OTHER PUBLICATIONS

M. Arai et al., "Phase Transition of CuITe", Journal of Thermal Analysis and Calorimetry, vol. 69, pp. 905-908. (Year: 2002).*
Arai, Masaji et al., "Phase transition of CuBrTexSe1-x", Solid State Ionics 136-137, pp. 419-422. (Year: 2000).*
Pfitzner, Arno et al., "CuBrSe2: a Metastable Compound in the System CuBr/Se", Z. anorg. allg Chem. 1999, 625, pp. 201-206. (Year: 1999).*
Oldenbourg Wissenschaftsver GmbH, "Mixed chalcogen rings in copper(I) halides: crystal structures of CuBrSe2.36S0.64, CuISe2.6S0.4, and CuISe1.93Te1.07", Zeitschrift fur Kristallographie—Crystalline Materials, abstract. (Year: 1997).*
Pfitzner, Arno et al., "(CuI)3Cu2TeS3: Layers of Cu2TeS3 in Copper(I) Iodide", Angev. Chem. Int. Ed. Engl., 36, No. 9, pp. 982-984. (Year: 1997).*
Androulakis et al., Dimensional Reduction: A Design Tool for New Radiation Detection Materials, Adv. Mater. 23, Aug. 9, 2011, pp. 4163-4167.
Peters et al., Investigation of defect levels in Cs2Hg6S7 single crystals by photoconductivity and photoluminescence spectroscopies, J. Appl. Phys. 112, Sep. 19, 2012, 063702-1-063702-6.
Li et al., Investigation of Semi-Insulating Cs2Hg6S7 and Cs2Hg6-xCdxS7 Alloy for Hard Radiation Detection, Cryst. Growth Des. 14, Sep. 23, 2014, pp. 5949-5956.
Liu et al., Photo-Induced Current Transient Spectroscopy of Semi-insulating Single Crystal Cs2Hg6S7, J. Electron. Mater. 44, 2015, pp. 222-226.
Im et al., Formation of native defects in the c-ray detector material Cs2Hg6S7, Appl. Phys. Lett. 101, Nov. 13, 2012, pp. 202103-1-202103-4.
Li et al., Crystal Growth and Characterization of the X-ray and γ-ray Detector Material Cs2Hg6S7, Cryst. Growth Des. 12, May 9, 2012, pp. 3250-3256.
Wibowo et al., Photoconductivity in the Chalcohalide Semiconductor, SbSeI: a New Candidate for Hard Radiation Detection, Inorg. Chem. 52, May 28, 2013, pp. 7045-7050.
Wang et al., Hard Radiation Detection from the Selenophosphate Pb2P2Se6, Adv. Funct. Mater. 25, Jul. 2, 2015, pp. 4874-4881.
Nguyen et al., Photoconductivity in Tl6SI4: A Novel Semiconductor for Hard Radiation Detection Chem. Mater. 25, Jul. 8, 2013, pp. 2868-2877.
Stoumpos et al., Crystal Growth of the Perovskite Semiconductor CsPbBr3: A New Material for High-Energy Radiation Detection, Cryst. Growth Des. 13, Jun. 3, 2013, pp. 2722-2727.
Kostina et ai., Photoluminescence fatigue and inhomogeneous line broadening in semiinsulating Tl6SeI4 single crystals, Semicond. Sci. Technol. 31, Apr. 14, 2016, pp. 065009.
Johnsen et al., Thallium Chalcogenide-Based Wide-Band-Gap Semiconductors: TlGaSe2 for Radiation Detectors, Chem. Mater. 23, May 31, 2011, pp. 3120-3128.
Wang et al., Refined Synthesis and Crystal Growth of Pb2P2Se6 for Hard Radiation Detectors, Crystal Growth & Design, vol. 16, Issue 9, Jul. 26, 2016, pp. 5100-5109.
Clark et al., Polarization-selective three-photon absorption and subsequent photoluminescence in CsPbBr3 single crystal at room temperature, Phys. Rev. B 93, May 5, 2016, pp. 195202-1-195202-8.
International Search Report and Written Opinion received in PCT/US2018/042251, dated Sep. 18, 2018, pp. 1-7.
Lin et al., Cu2I2Se6: A Metal-Inorganic-Framework Wide-bandgap Semiconductor for Photon Detection at Room Temperature, Journal of the American Chemical Society, Jan. 14, 2018, pp. 1894-1899.
Mercouri Kanatzidis, Novel Chalcogenide Materials for x-ray and γ-ray Detection, Technical Report May 2016, Defense Threat Reduction Agency, DTRA-TR-16-53, pp. 1-64.
Arachchige et al., Mercouri G. Kanatzidis: Excellence and Innovations in Inorganic and Solid-State Chemistry, Inorg. Chem. 56, Jul. 27, 2017, pp. 7582-7597.
Rabenau et al., Spectral reflectance measurements on ternary compounds of copper with group VI and VII elements. Solid State Commun. 7, 1281-1282 (1969).
Milius et al., A. The crystal-structure of copper iodide triselenide CuISe3, a reactant in an n-CuInSe2 based solar-cell. Mater. Res. Bull. 22, 1493-1497 (1987).
Rabenau et al., Chalcogenidehalides of copper. Z,. Anorg. Allg. Chem. 374, 43-53 (1970). English Abstract only.

* cited by examiner

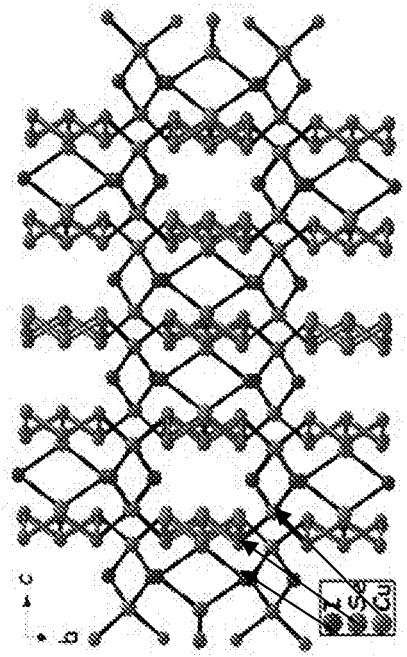
FIG. 2A
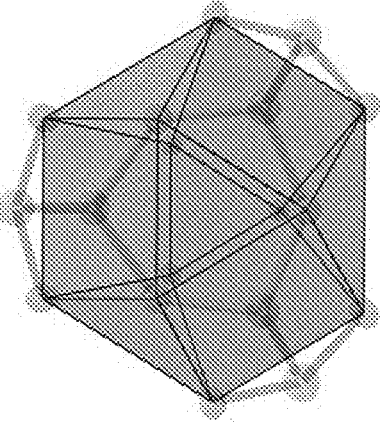
FIG. 2B
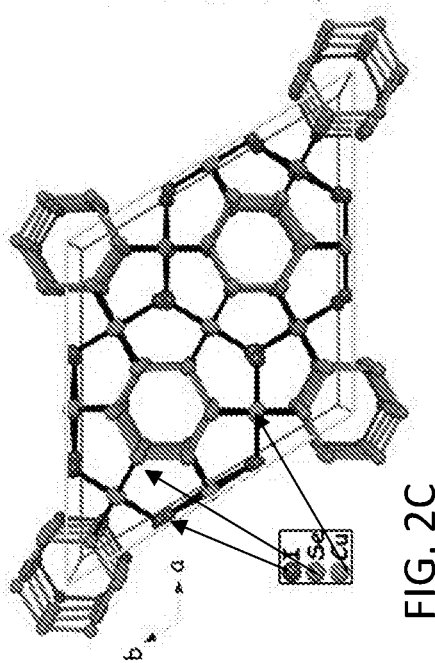
FIG. 2C
FIG. 2D
FIG. 2E
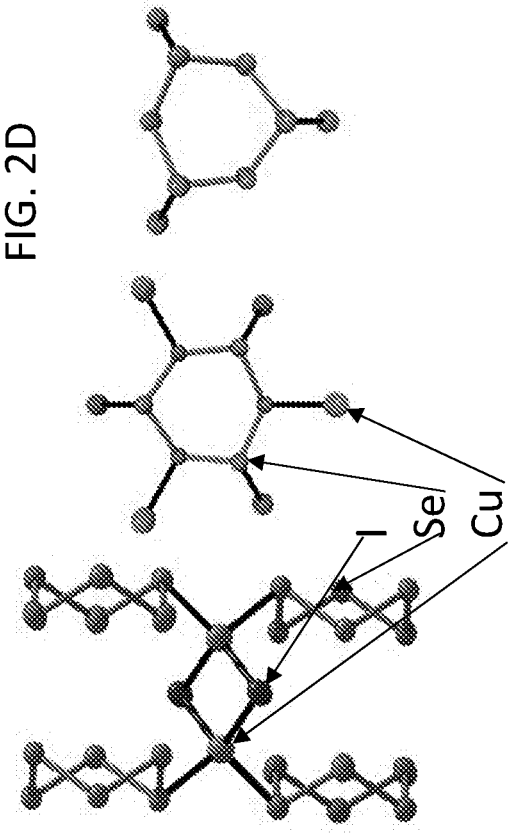

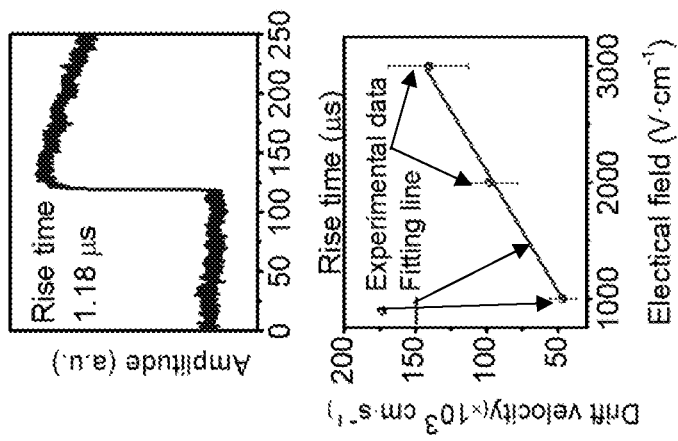
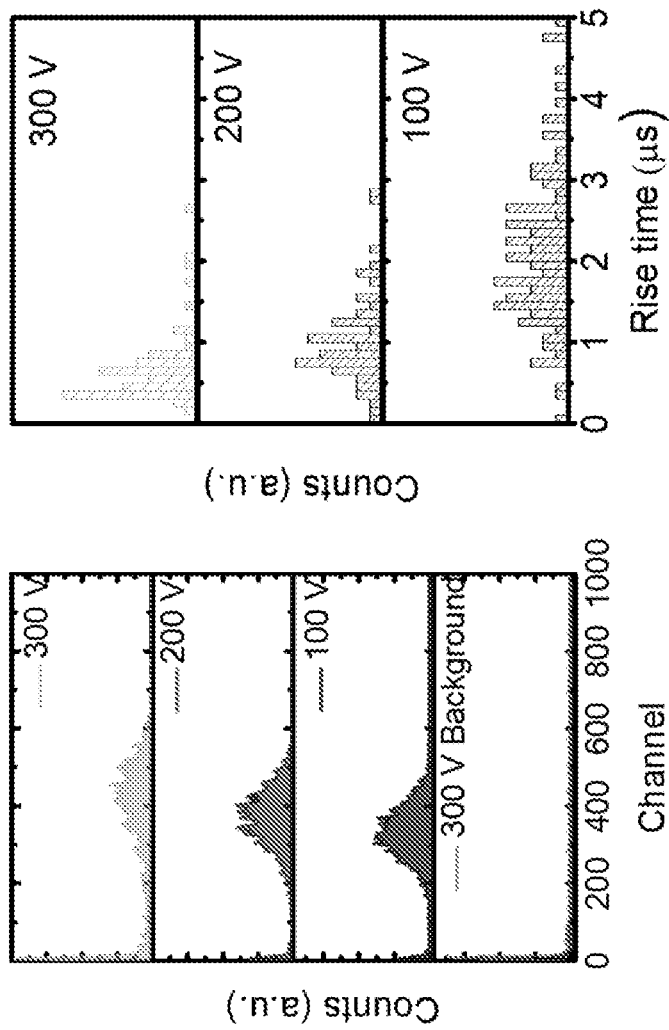
FIG. 5A  FIG. 5B  FIG. 5C  FIG. 5D

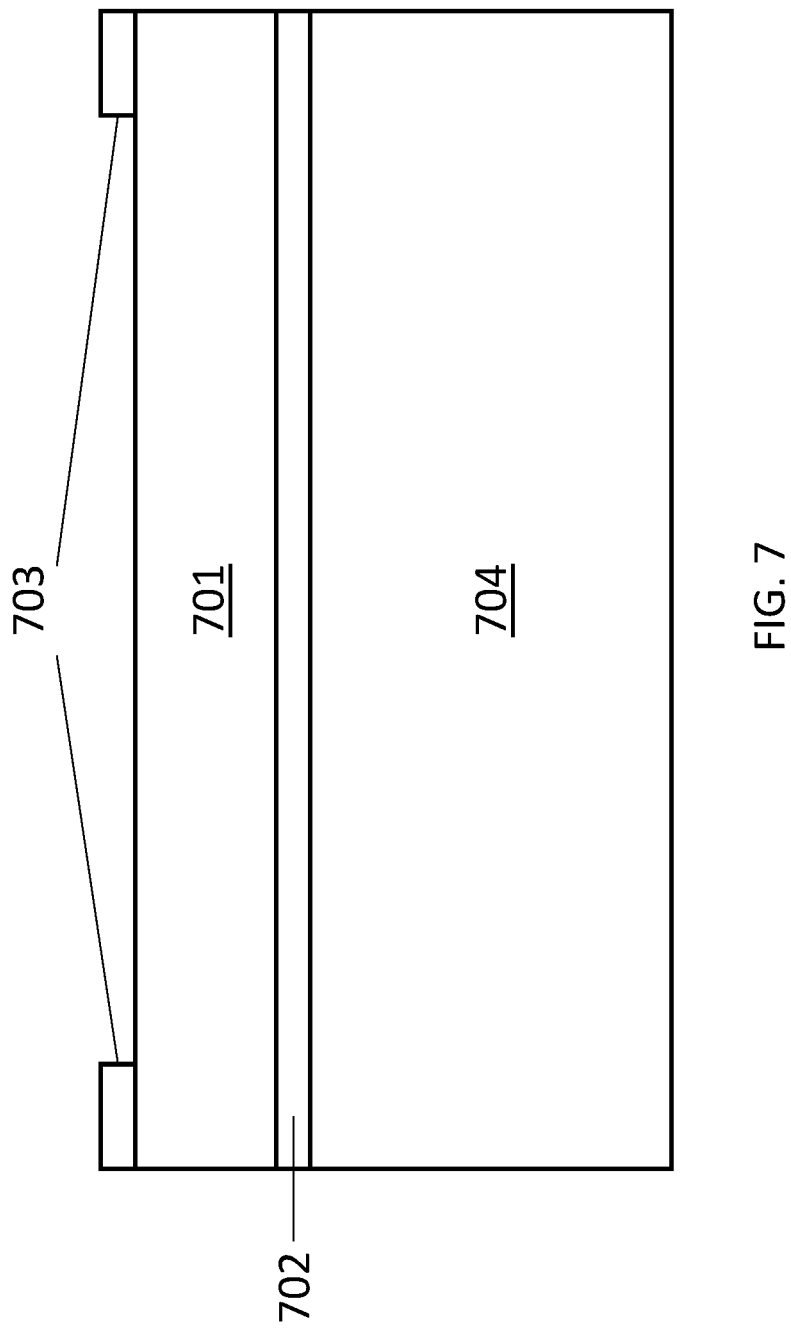

COPPER HALIDE CHALCOGENIDE SEMICONDUCTOR COMPOUNDS FOR PHOTONIC DEVICES

CROSS-REFERENCE TO RELATED APPLICATIONS

This application is a National Stage of International Application No. PCT/US2018/042251, filed Jul. 16, 2018, which claims the benefit of U.S. Patent Application No. 62/533,289, filed Jul. 17, 2017, the contents of which are herein incorporated by reference.

REFERENCE TO GOVERNMENT RIGHTS

This invention was made with government support under 2014-DN-077-ARI086 awarded by the Department of Homeland Security. The government has certain rights in the invention.

BACKGROUND

Hard radiation (for example, x-ray, α-particle, and γ-ray radiation) detectors operating at room temperature are highly sought after for applications in nuclear medicine, non-proliferation of nuclear materials, and outer space exploration. Compared with traditional scintillator detectors which require bulky photomultipliers, semiconductor detectors promise higher resolution and can be made much more compact owing to the facile conversion of incident photons into electric signals. An ideal semiconductor with high detection performance for hard radiation should possess a series of strict physical properties, including high photon stopping power, high resistivity, reasonably wide bandgap to suppress ionization of carriers at room temperature, high carrier mobility-lifetime product, low-concentration of carrier trapping centers and high chemical stability. Therefore, only a few compounds have been identified as hard radiation semiconductor detection materials. The leading materials with spectroscopic performance are $Cd_{0.9}Zn_{0.1}Te$ (CZT), TlBr, $HgI_2$ and $PbI_2$. However, some serious issues such as intrinsic defects (CZT), polarization effects (TlBr), and low mechanical processability ($PbI_2$ and $HgI_2$) plague these compounds.

SUMMARY

Methods and devices that use copper halide chalcogenide semiconductor materials to convert incident particle radiation or electromagnetic radiation, such as incident x-rays, gamma-rays, alpha particle radiation, or solar, into an electric signal are provided. The copper halide chalcogenides include $Cu_2I_2Se_6$ and its solid solutions, which include other halogens and/or other chalcogens. Examples of these have the formulas $Cu_2I_xBr_{2-x}Se_yTe_{6-y}$ and $Cu_2I_xBr_{2-x}Se_yS_{6-y}$, where $0 \leq x \leq 1$ and $0 \leq y \leq 3$.

One embodiment of a method for detecting incident radiation includes the steps of: exposing a layer comprising a copper halide chalcogenide metal inorganic framework (for example, $Cu_2I_2Se_6$), to incident gamma radiation, x-ray radiation, particle radiation, or a combination of two or more thereof, wherein the material absorbs the incident radiation and electron-hole pairs are generated in the material; and measuring at least one of the energy and intensity of the absorbed incident radiation by detecting the generated electrons, holes, or both.

One embodiment of a device for the detection of incident radiation includes: (a) a material comprising a copper halide chalcogenide metal inorganic framework (for example, $Cu_2I_2Se_6$); (b) a first electrode in electrical communication with the material; (c) a second electrode in electrical communication with the material, wherein the first and second electrodes are configured to apply an electric field across the material; and (d) a detector configured to measure a signal generated by electron-hole pairs that are formed when the material is exposed to incident gamma radiation, x-ray radiation, particle radiation, or a combination of two or more thereof.

One embodiment of a method for operating a photovoltaic cell includes the steps of: exposing a layer comprising a copper halide chalcogenide metal inorganic framework (for example, $Cu_2I_2Se_6$) under an applied electric field, to incident solar radiation, wherein the material absorbs the incident radiation and electron-hole pairs are generated in the material to produce a photocurrent.

One embodiment of a photovoltaic cell includes: (a) a first electrode comprising an electrically conductive material; (b) a second electrode comprising an electrically conductive material; (c) a photoactive material disposed between, and in electrical communication with, the first and second electrodes, the photoactive material comprising a metal inorganic framework having the formula $Cu_2I_2Se_6$ to; and (d) a hole transporting material disposed between the first and second electrodes and configured to facilitate the transport of holes generated in the photoactive material to one of the first and second electrodes.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 1A shows the power X-ray diffraction pattern of a pulverized ingot specimen and simulated pattern from the refined crystal structure. FIG. 1B shows a differential thermal analysis (DTA) scan of $Cu_2I_2Se_6$, which is a congruently melting compound. FIG. 1C depicts the optical absorption spectrum and bandgap of $Cu_2I_2Se_6$.

FIGS. 2A-2E. The crystal structure of $Cu_2I_2Se_6$. FIG. 2A shows a view of the unit cell along the c-axis. FIG. 2B shows a view of the unit cell along the ab-plane. FIG. 2C depicts a side view of the $[Cu_2I_2(Se_6)_4]$ dimer highlighting the bonding interactions between the $(Cu_2I_2)$ and the $Se_6$ linkers. FIG. 2D shows the two distinct coordination modes of the $Se_6$ linkers featuring $\mu_6$ mode for the Se1 ring and a $\mu_3$ mode for Se2/Se3 ring which bind exclusively through $Se_2$. FIG. 2E depicts the triangular orthobicupolar cavity in the inorganic framework formed between two consecutive $Se_6$ rings (the Se1 and Se2/Se3 rings).

FIG. 3A depicts the electronic band structure. FIG. 3B shows a view of first Brillouin zone in reciprocal space showing the principle directions. FIG. 3C depicts the projected electronic density of states. The Fermi level ($E_F$) is set to zero energy.

FIG. 4A shows I-V characteristic under dark.

FIG. 4B shows the photocurrent response to 22 keV Ag X-rays by switching the X-ray source on and off at an applied bias of 100 V (ON-OFF ratio 750:1).

FIGS. 5A-5D. The detection performance and electron mobility estimation of the $Cu_2I_2Se_6$ detector. FIG. 5A shows the $^{241}Am$ α-particles' (5.5 MeV) spectral response under various biases. FIG. 5B shows the histogram of electron rise time distribution for the detector under various biases. FIG. 5C shows a typical electron transient pulse from one radiation event collected by preamplifier at a bias of 100 V for estimating electron rise time. FIG. 5D shows the linear fitting of electron drift mobility according to equation (1).

FIG. 7 is a cross-sectional view of a radiation detector.

DETAILED DESCRIPTION

Figure 1A:
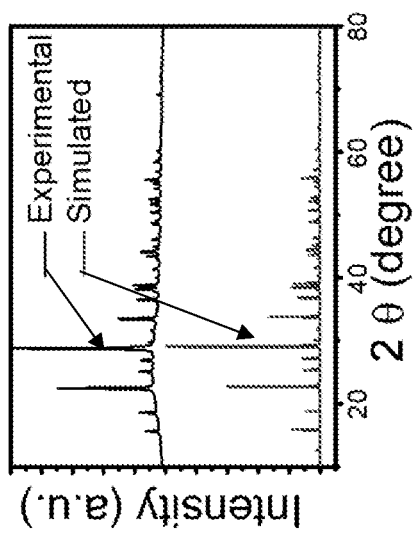
FIGS. 1A-1C. Crystal growth and characterization of $Cu_2I_2Se_6$.

A semiconductor material having the molecular formula $Cu_2I_2Se_6$ is provided. Also provided are solid solutions of semiconductor materials having the formulas $Cu_2I_xBr_{2-x}Se_yTe_{6-y}$ and $Cu_2I_xBr_{2-x}Se_yS_{6-y}$, where $0≤x≤1$ and $0≤y≤3$. Methods and devices that use the semiconductor materials to convert incident radiation into an electric signal are also provided. The devices include optoelectronic and photonic devices, such as photodetectors, photodiodes, and photovoltaic cells.

The $Cu_2I_2Se_6$ is a three-dimensional (3D) metal inorganic framework. Metal inorganic frameworks are crystalline, porous materials made from metallinker networks that include inorganic nodes connected by inorganic molecular chains (i.e., linkers). The $Cu_2I_2Se_6$ metal inorganic frameworks of the present disclosure have $[Cu_2I_2]$ nodes connected by $Se_6$ linkers. High purity, high quality singlecrystals of the $Cu_2I_2Se_6$ can be used as a photoactive material in a variety of optoelectronic and photonic devices.

The solid solutions of the semiconductor materials are solid mixture of two or more crystalline solids, including crystalline $Cu_2I_2Se_6$. The solid solutions are represented by the formulas $Cu_2I_xBr_{2-x}Se_yTe_{6-y}$ and $Cu_2I_xBr_{2-x}Se_yS_{6-y}$, where $0≤x≤1$ and $0≤y≤3$.

Detector-grade crystals of the copper halide chalcogenide metal inorganic frameworks can be grown with high chemical purity and high crystal quality. For example, single crystals can be grown from a stoichiometric melt using a vertical Bridgman method, as illustrated in the Example below. Crystals having diameters of at least 0.5 cm or at least 1 cm can be grown.

One aspect of the invention provides devices for the detection of incident radiation. A schematic diagram of one embodiment of the detector is shown in FIG. 7. In this embodiment, the device includes: a layer comprising a metal inorganic framework of $Cu_2I_2Se_6$ 701, which may be a solid solution the includes the $Cu_2I_2Se_6$; a first electrode 702 in electrical communication with layer 701; a second electrode 703 in electrical communication with layer 701; and a supporting substrate. In such devices the first and second electrodes are configured to apply an electric field (i.e., an applied bias) across the layer comprising the metal inorganic framework. When incident radiation is absorbed by the copper halide chalcogenide of layer 701, electron-hole pairs are formed in the material and a photocurrent is generated. The devices can further comprise one or more additional electronic components configured to measure the photocurrent. The incident radiation can comprise particle radiation, such as alpha particle radiation or electromagnetic radiation, such as gamma radiation (i.e., wavelengths in the range from about $1×10^{-10}$ to about $2×10^{-13}$ meters) and/or x-ray region radiation (i.e., wavelengths in the range from about 0.01 to 10 nanometers). Some embodiments of the detectors are operable at room temperature (e.g., at temperatures in the range from about 20° C. to about 25° C.).

Radiation detectors incorporating copper halide chalcogenides, such as $Cu_2I_2Se_6$, are characterized by high electron mobilities ($μ_e$), including electron mobilities greater than 35 $cm^2 V^{-1} s^{-1}$, and further including electron mobilities greater than 40 $cm^2 V^{-1} s^{-1}$ and greater than 45 $cm^2 V^{-1} s^{-1}$. Methods of determining the electron mobilities of a radiation detector are described in the Example.

Embodiments of the $Cu_2I_2Se_6$ or solid solutions thereof also can be used in photovoltaic cells as photoactive materials that absorb light, such as sunlight, and generate electron-hole pairs. Photovoltaic cells incorporating the copper halide chalcogenides single crystals as a photoactive material can take on a variety of forms. Generally, however, the cells will comprise a first electrode comprising an electrically conductive material; a second electrode comprising an electrically conductive material; a light absorbing layer comprising the copper halide chalcogenide disposed between (including partially between) and in electrical communication with the first and second electrodes; a hole transporting material, which may be an organic or inorganic hole transport material, disposed between (including partially between) the first and second electrodes and configured to facilitate the transport of holes (that is, to provide preferential transport of holes relative to electrons) generated in the light absorbing layer to one of the first or second electrodes; and an electron transporting layer, disposed between (including partially between) the first and second electrodes and configured to facilitate the transport of electrons (that is, to provide preferential transport of electrons relative to holes) generated in the light absorbing layer to one of the first or second electrodes, optionally under an applied electric field. In some cells, the light absorbing layer takes the form of a porous film (e.g., a film comprising a collection of semiconducting nanoparticles, such as titanium dioxide nanoparticles) coated with the copper halide chalcogenide, wherein the coating infiltrates into the pores of the porous film. Other layers commonly used in thin film photovoltaic cells, such as hole blocking layers and the like, may also be incorporated into the photovoltaic cells. In some embodiments of the photovoltaic cells, a hole transporting layer is disposed between the first electrode and the light absorbing layer and an electron transporting layer is disposed between the second electrode and the light absorbing layer.

Triarylamine derivatives, such as spiro-MeOTAD (2,2',7,7'-tetrakis(N,N-di-p-methoxyphenylamine)-9,9-spirobifluorene), and poly(triaryl amine) (PTAA) doped with 4-isopropyl-4'-methyldiphenyliodonium tetrakis(pentafluorophenyl) borate (TPFB) are examples of suitable organic hole transport materials for use in the present photovoltaic cells.

Various materials may be used as an electron transporting layer, provided the material is capable of transporting electrons generated by the copper halide chalcogenides. Metal oxides, metal sulfides, and organic semiconductors are suitable materials. Illustrative metal oxides include $TiO_2$, ZnO, $SnO_2$, $Nb_2O_5$ and $SrTiO_3$. Illustrative metal sulfides include ZnS and CdS. The metal oxides and sulfides may be doped. Illustrative organic semiconductors are n-type polymers, small molecules, and derivatives of small molecules. C60, C70, [6,6]-phenyl-C61-butyric acid methyl ester (PCBM), indene-C60 bisadduct (ICBA), indene C60 tris adduct (ICTA), bis-PCBM, and combinations thereof are some examples of organic electron transport materials.

At least one of the two electrodes is desirably transparent to the incident radiation (e.g., solar radiation). The transparent nature of the electrode can be accomplished by constructing the electrode from a transparent material or by using an electrode that does not completely cover the incident surface of the cell (e.g., a patterned electrode). One example of a transparent electrode comprises a transparent conducting oxide (e.g., fluorine-doped tin oxide (FTO)) coating on a transparent substrate.

EXAMPLES

Example 1

$Cu_2I_2Se_6$

Figure 6:
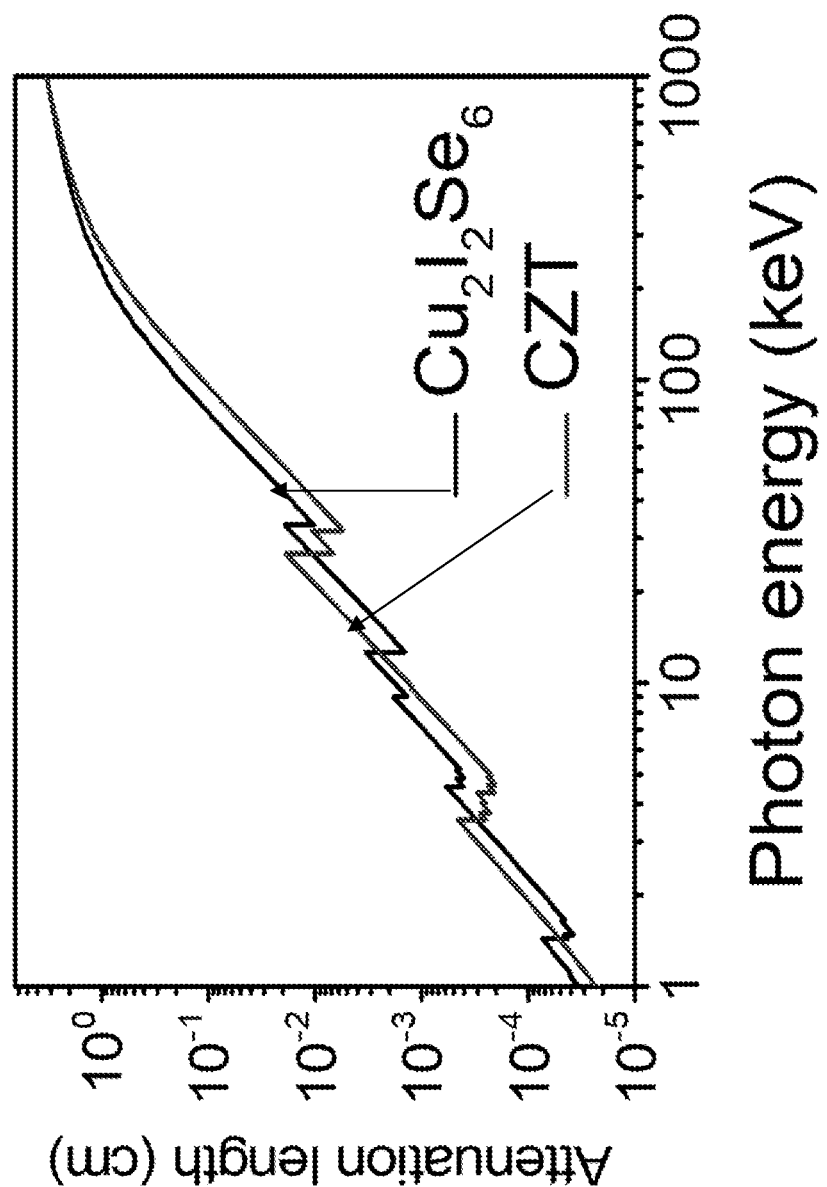
FIG. 6 depicts the attenuation lengths of $Cu_2I_2Se_6$ and CZT as a function of photon energy.

In this example, $Cu_2I_2Se_6$ is presented as a semiconductor compound for hard radiation detection. $Cu_2I_2Se_6$ is a three-dimensional (3D) metal inorganic framework consisting of $[Cu_2I_2]$ nodes and $Se_6$ linkers. The compound derives directly from elemental selenium, an "ancient" semiconductor with a high photoconductivity contrast ratio under energetic photons. One of the main technological problems in employing Se in X-ray detection devices is the presence of different allotropes with the semi-insulating, photoconducting, amorphous Se ($E_g$~2.2 eV), which crystallizes into the semiconducting black crystalline Se ($E_g$~1.7 eV) upon prolonged irradiation. The instability of amorphous Se arises from the inhomogeneity of its components, which are comprised of random distributions of $Se_6$, $Se_7$, and $Se_8$ molecular rings and finite sized $[Se]_n$ chains. $Cu_2I_2Se_6$, on the other hand, is a highly crystalline compound with defined crystallographic positions for the $Se_6$ rings which are held together by direct coordination to the Cu atoms. The Cu—Se bonding "locks" the crystal structure so that prolonged irradiation does not cause a phase change to a different allotrope. $Cu_2I_2Se_6$ has a bandgap of ~2.0 eV, which is suitable for suppressing room temperature electron ionization and obtaining a high resistivity. In addition, this compound has high chemical stability and dense crystal packing (d=5.29 g/cm³), which provide high photon stopping power (FIG. 6).

In this example, it is demonstrated that $Cu_2I_2Se_6$ can be used for hard radiation detection at room temperature. The synthesis, crystal growth, crystal structure, charge transport properties, detection performance, and calculation of the electronic structure of $Cu_2I_2Se_6$ are reported. The compound had a wide bandgap of $E_g$=1.95 eV and melted congruently at a relatively low temperature (T=397° C.), which allowed for simpler material purification and crystal growth. The compound was free of phase transitions between its melting point and ambient temperature and is highly air-stable. Centimeter-sized $Cu_2I_2Se_6$ crystals were grown from the stoichiometric melt by the typical vertical Bridgman method, yielding large single crystalline boules which were subsequently processed to fabricate detectors. (See, e.g., Bridgman, P. W. Certain physical properties of single crystals of tungsten, antimony, bismuth, tellurium, cadmium, zinc, and tin. *Proc. Natl. Acad. Sci.* 60, 305-383 (1925).) Thanks to its wide bandgap, the resistivity of the compound reached the order of $\rho=10^{12}$ Ω·cm, which was ideal for fabrication of detectors with a low dark current. The planar-type detector made of a single crystal exhibited photo sensitivity to hard 22 keV Ag X-rays and showed spectroscopic performance against 5.5 MeV $^{241}$Am α-particles. Drift mobility measurements using α-particles revealed an electron mobility $\mu_e$ of 46±9.2 cm²·V⁻¹·s⁻¹, which is comparable to the leading material TlBr. (See, e.g., Hitomi, K., et al., Advances in TlBr detector development. *J. Cryst. Growth* 379, 93-98 (2013).)

Synthesis, Crystal Growth and Characterization

Figure 1C:
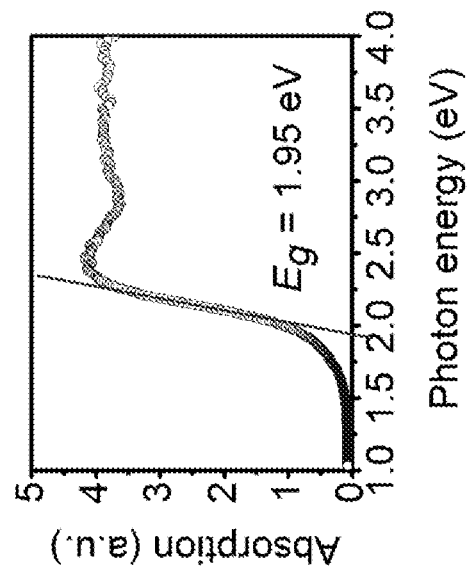
Figure 1B:
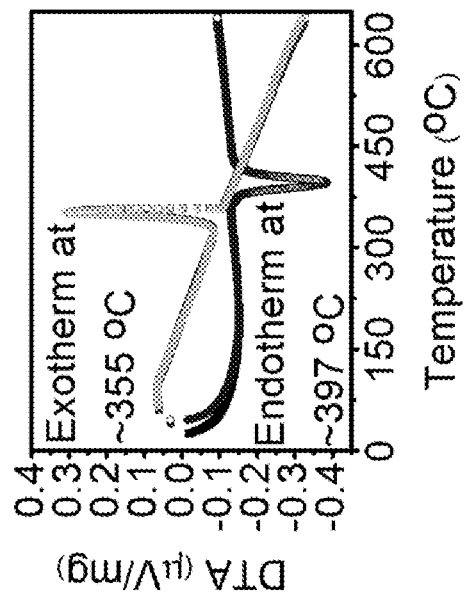

Polycrystalline $Cu_2I_2Se_6$ raw material was synthesized by a stoichiometric direct combination of Cu foils (Alfa Aesar, 99.999% purity), Se shots (Alfa Aesar, 99.999% purity), and I2 lumps (Alfa Aesar, 99.999% purity), with the appropriate stoichiometry at 500° C. for 24 h in a rocking furnace. The obtained raw material was subsequently used to grow a single crystalline boule via the vertical two-zone Bridgman method. The entire boule appeared black in color and had good coherence. No visible cracks were observed, suggesting the crystal could endure a large temperature gradient of 19 K·cm⁻¹, which was employed during Bridgman growth. Since this compound had a 3D inorganic lattice, the as-grown ingot could not be cleaved. The ingot was a pure phase, as judged by its powder X-ray diffraction pattern on a ground ingot specimen, as shown in FIG. 1A. Differential thermal analysis (FIG. 1B) revealed that this compound melted congruently at 397° C., which agrees with the reported value 394° C. Importantly, the compound had no phase transitions between melting point and ambient temperature, which was beneficial in obtaining a high crystal quality. In addition, the low melting point was not only favorable for material purification and crystal growth, but also for suppressing the formation of thermally activated defects. FIG. 1C shows the optical absorption spectrum and a bandgap of 1.95 eV, corresponding well to the dark red color. $Cu_2I_2Se_6$ is well-suited for hard radiation detection, as its bandgap is narrow enough to create more photo-induced electron-hole pairs due to a lower pair creation energy, and yet large enough to suppress the formation of thermally activated charger carriers.

Crystal Structure $Cu_2I_2Se_6$ crystallized in the rhombohedral $R\bar{3}m$ space group, with a=14.0392(9) Å, c=14.1531(10) Å, V=2415.83(10) Å³, Z=9, and had a calculated density of d=5.287 g/cm³. The crystal structure of $Cu_2I_2Se_6$ consisted of a 3D inorganic coordination framework comprised of coordinatively unsaturated $[Cu_2I_2]$ dimers linked together through molecular $Se_6$ rings (FIGS. 2A and 2B). The $[Cu_2I_2]$ molecules were formed through symmetric bridging of the two metals with two iodide ions, leaving two coordination sites available on each Cu ion. These two sites were occupied by two Se atoms from two adjacent $Se_6$ rings to complete a tetrahedral coordination geometry around the $Cu^I$ ions, forming a dimer type reminiscent of the $Al_2Cl_6$ molecular structure (FIG. 2C). The $[Cu_2I_2]$ dimers were co-planar in the c-direction, but they rotate about the screw 3-fold axis which runs along the iodide ions. The molecular $Se_6$ rings adopted a regular chair configuration and exhibited two different coordination motifs. The ring comprised of Se1 atoms, which sits on an inversion center about the proper 3-fold symmetry axis, coordinated to six Cu ions, while the ring comprised of three Se2 and three Se3 atoms, also sitting on the proper 3-fold axis, was bound to three Cu atoms, bonding exclusively through Se2 in a cis, cis, cis coordination mode with remaining unbound Se3 (FIG. 2D). All $Se_6$ rings stacked along the crystallographic c-axis, filling the "channels" formed between the $[Cu_2I_2]$ dimers. This configuration motif led to a cage that was a convex 14-face polyhedron (triangular orthobicupola, Johnson polyhedron #27) with a volume of ~110 Å³ (FIG. 2E).

All bonding parameters (see Tables 1-3) were in good agreement with the expected bond length and angles. The Cu—I bond length was 2.635(1) Å, slightly elongated with respect to γ-CuI (ZnS-type, 2.620 Å), while the Cu—Se distance varied slightly depending on whether the Cu was bound to the fully coordinated $Se_6$ ring (Cu—Se1=2.463(1) Å) or the half-coordinated $Se_6$ ring (Cu—Se2=2.450(1) Å), with both distances being smaller that the Cu—Se distances in $Cu_{2-x}Se$ ($Na_2O$-type, 2.501 Å). (See, e.g., Buhrer, W., et al., Crystal-structure of high-temperature cuprous iodide and cuprous bromide. *Electrochim. Acta.* 22, 701-704 (1977); and Machado, K. D. et al. Structural study of $Cu_{2-x}Se$ alloys produced by mechanical alloying. *Acta. Crystallogr. B* 60, 282-286 (2004).) Likewise, the bonding parameters in the $Se_6$ varied according to the number of Cu ions attached to the ring; the ring bearing six Cu ions had a Se—Se distance of Se1-Se1=2.381(1) Å and a Se1-Se1-Se1 bond angle of 98.62(3)°, whereas the ring bearing three Cu ions had a Se—Se distance of Se1-Se1=2.360(1) Å and bond angles of Se2-Se3-Se2=99.69(3)° and Se3-Se2-Se3=102.20(3)°. These parameters indicated that the $Se_6$ rings in $Cu_2I_2Se_6$ were slightly puckered with respect to the $Se_6$ rings in the rhombohedral $Se_6$ allotrope, which had Se—Se distances of 2.356(9) and Se—Se—Se angles of 101.1(3)° as a result of the coordination of the rings to the Cu ions. Remarkably, $Cu_2I_2Se_6$ represents a chemically stable compound made by a structural blending of two unstable binary compounds. CuI is well-known for its tendency to lose Cu and to release $I_2$, while molecular Se is metastable with respect to its various allotropes.

Electronic Structure Calculations

Figure 3C:
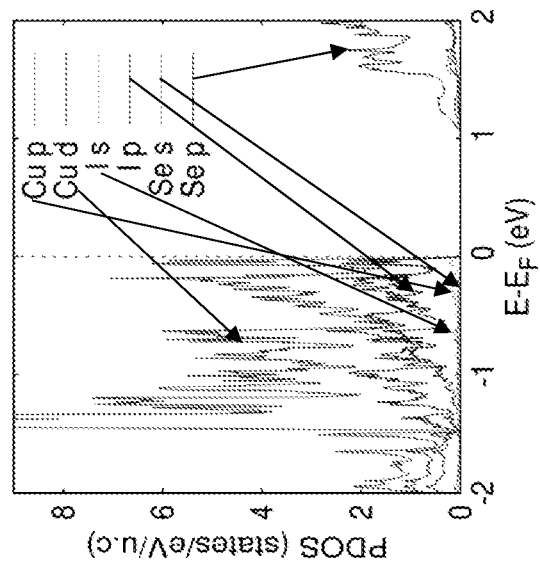
FIGS. 3A-3C show the electronic band structure of $Cu_2I_2Se_6$.
Figure 3B:
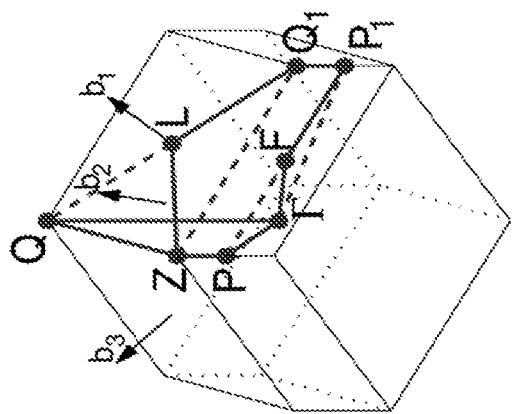
Figure 3A:
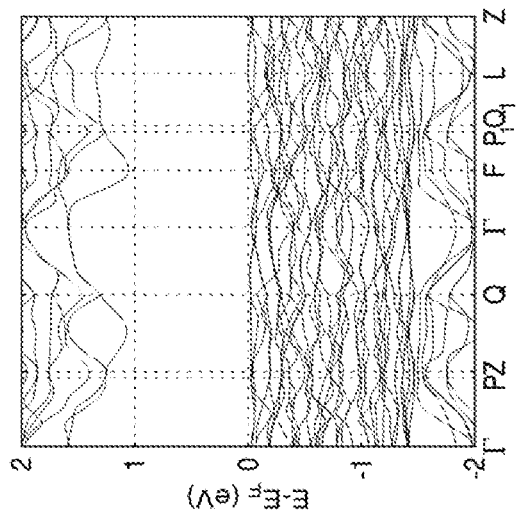

The DFT calculated electronic structure of $Cu_2I_2Se_6$ is shown in FIG. 3A. The calculated band structure showed that $Cu_2I_2Se_6$ had an indirect band gap with the conduction band minimum (CBM) located at the F point, and the valence band maximum (VBM) was at the L point. The valence bands near VBM, consisting of Cu 3d, Se 4p and I 5p orbitals, showed almost no dispersion, whereas the CBM, which consists mainly of Se p orbitals, had a significant dispersion, which translates into low electron effective masses. The calculated principal electron effective masses were $m_{e,xx}=0.32\ m_0$, $m_{e,yy}=0.33\ m_0$, and $m_{e,zz}=0.90\ m_0$ along the three crystallographic directions. Note that the $m_{e,xx}$ and $m_{e,yy}$ components were significantly lower than the $m_{e,zz}$ component of the electron effective mass tensor. According to these characteristics, a higher µτ value for electrons was expected from detectors made of $Cu_2I_2Se_6$, if the electric field were applied along the ab plane of the crystal. From the PDOS calculations (FIG. 3C), it can be seen that the CBM was dominated by Se p states, with some contribution from Cu d-Se p hybridized orbitals. Thus, it can be concluded that the high dispersion of the CBM and low electron effective masses were mainly due to strong Se ppσ* orbital interaction in the $Se_6/Cu_2I_2$ sheets along the ab plane in the structure (see FIG. 2B).

In contrast to electrons, the calculated hole effective masses were significantly higher and were also very anisotropic: $m_{h,xx}=2.1\ m_0$, $m_{h,yy}=4.0\ m_0$, $m_{e,zz}=14.3\ m_0$; therefore, hole mobility was expected to be negligible. The calculated PDOS (FIG. 3C) showed that the VBM mainly consisted of contributions from Cu d, Se p and I p orbitals, with the Cu d contribution being dominant. It could be therefore inferred that VBM was formed by a sequence of localized Cu d-Se p and Cu d-I p interactions taking place between the $Se_6/Cu_2I_2$ and I planes along the c direction in the structure. Such weak and localized interactions were responsible for the nearly flat character of the VBM bands and high hole effective masses.

Charge Transport Properties and Detector Performance

Figure 4B:
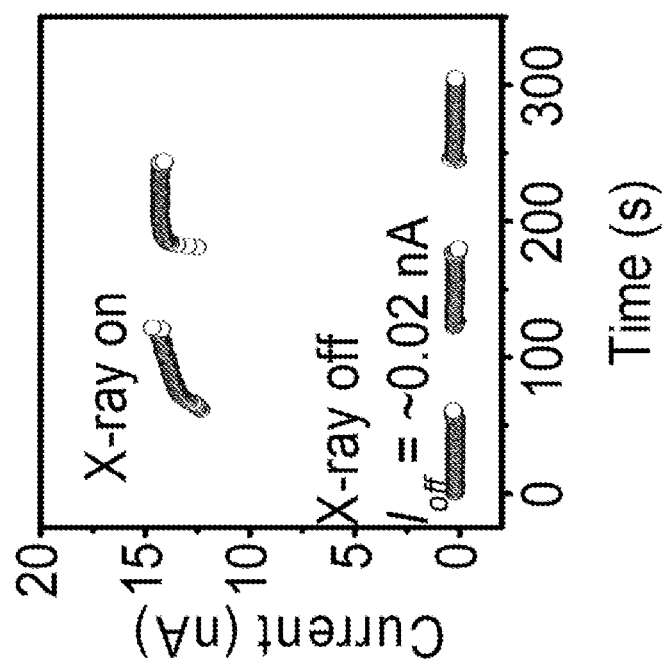
FIGS. 4A-4B. Charge transport properties and detection performance of the $Cu_2I_2Se_6$ detector made from 1.0 mm thick wafer.
Figure 4A:
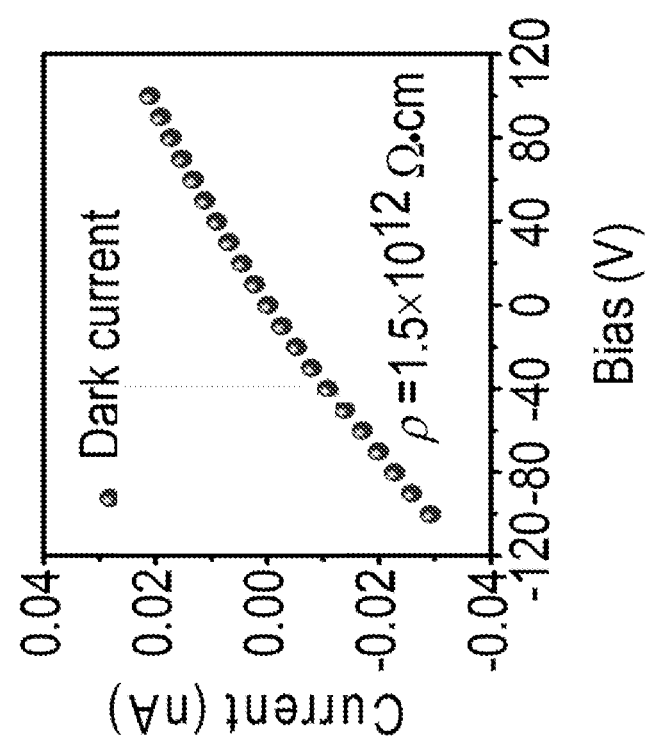

The current leakage of a detector made from $Cu_2I_2Se_6$ single crystalline wafers was measured. The typical detector was made from a 1.0 mm thick $Cu_2I_2Se_6$ wafer with carbon paint electrodes of 2 mm in diameter. FIG. 4A show the I-V characteristics of the detector under dark. The I-V curve of detector was almost linear in the bias range from −100 V to +100 V, suggesting high field stability and the absence of a space charge effect. The resistivity derived from the I-V curve by linear fitting was ~$1.5\times10^{12}$ Ω·cm, which revealed a very low background noise for hard radiation detection. This high resistivity could be easily obtained without delicate control on growth conditions, extensive purification of starting materials, or intentional doping. In contrast, it was not straightforward to obtain a high resistivity $10^{10}$ Ω·cm for CZT crystals without doping and careful control on the melt composition. FIG. 4B shows the spontaneous and sensitive photo-response of the detector against a Ag Kα (22 keV) X-ray source at an applied bias of 100 V by switching the Ag X-ray source on and off. The ratio of photocurrent to dark current was ~750:1, indicating the detector was highly photosensitive to X-rays.

The detection performance of the material was also tested against 5.5 meV α-particles from an un-collimated $^{241}Am$ radiation source. FIG. 4C shows the α-particle spectral response as a function of applied voltage under electron-collection configuration (cathode irradiation). The detector clearly shows a photo-peak resolving the characteristic energy peak of α-particles (FIG. 5A), as indicated by the significant count rates of the detected photons. The α-particles induced a signal that could be easily distinguished from the background noise. Importantly, the photo-peak shifted to higher energy channels with increasing applied bias voltage, which is a decisive criterion to verify that the signal arises from the α-particles source and not from artifacts induced by the high voltage.

The electron mobility ($\mu_e$) of the detector, which is one important figure of merit for detection material, was estimated by measuring the electron drifting time ($t_{drift}$) for electrons from an interaction close to the cathode as the electron cloud drifted through the entire thickness of the detector. (See, e.g., Erickson, J. C., et al., Time of flight experimental studies of CdZnTe radiation detectors. *J. Electron Mater.* 29, 699-703 (2000); Sellin, P. J., et al., Drift mobility and mobility-lifetime products in CdTe:Cl grown by the travelling heater method. *IEEE Trans. Nucl. Sci.* 52, 3074-3078 (2005); and Szeles, C., CdZnTe and CdTe materials for X-ray and gamma ray radiation detector applications. *Phys. Status Solidi B* 241, 783-790, doi:10.1002/pssb.200304296 (2004).) The $\mu_e$ could be estimated by the following equation:

$$\mu_e = \frac{V_{drift}}{E} = \frac{D^2}{Ut_{drift}}, \quad (1)$$

where $V_{drift}$, D, E and U are the electron drift velocity, detector thickness, applied electric field and bias voltage, respectively. The electron drift time $t_{drift}$ was measured by recording the electron rise time from output pulse collected by the preamplifier. One hundred measurements of electron rise time were performed and averaged in order to enhance the reliability of the data.

FIG. 5B shows the distribution of electron rise time at various voltage biases. With increasing bias, the average electron rise time decreased because of increasing electron drift velocity. FIG. 5C illustrates one typical electron output pulse with an electron rise time of 1.18 μs using α-particles from $^{241}$Am. Since the attenuation length of the α-particles was much smaller than the detector thickness, the electron drifting time approximates the electron rising time. As shown in FIG. 5D, based on equation 1, the electron mobility of the $Cu_2I_2Se_6$ detector was estimated to be 46±9 $cm^2 \cdot V^{-1} \cdot s^{-1}$ by linear fitting the electron drift velocity as a function of electrical field, which is comparable to that of one of the leading detector materials TlBr (10-50 $cm^2 \cdot V^{-1} \cdot s^{-1}$), and higher by a factor of 30 relative to the values obtained for amorphous Se. (See, e.g., Hitomi, K., et al., Advances in TlBr detector development. *J. Cryst. Growth* 379, 93-98 (2013); and Woollam, A. J., *Photoconductive and optical properties of amorphous selenium*. National Aeronautics and Space Administration, 1971.) The measurement under hole-collection configuration (anode-irradiation configuration) showed no electron output pulses extracted from preamplifier, indicating poor hole mobility. This is consistent with the huge calculated average effective mass (3.768 $m_0$) of the holes discussed above.

Methods

Synthesis and Crystal Growth. The synthesis of $Cu_2I_2Se_6$ polycrystalline raw material was performed by the direct combination of elements (Cu foil, purity of 99.99%; $I_2$ lumps, purity of 99.999%; Se shots, purity of 99.999%; all from Alfa Aesar) in an evacuated silica ampoule at 500° C. for 24 h in a rocking furnace, followed by slow cooling to room temperature for 12 h. The heating temperature was 500° C. for the synthesis, which is higher than the melting point (397° C.) of $Cu_2I_2Se_6$ and thereby could ensure complete melting. The temperature of the furnace was increased slowly to avoid any possibility of explosion due to high vapor pressure of $I_2$ and Se precursors. Afterward, the polycrystalline raw material was put into a conical-bottom quartz ampoule with an inner diameter of 10 mm, which was sealed at a vacuum pressure of $1 \times 10^{-4}$ mbar. A single crystalline boule of $Cu_2I_2Se_6$ was grown from the stoichiometric melt by the vertical Bridgman method equipped with a translation platform. At the beginning of the growth process, the ampoule was held in the hot zone (420° C.) of a two-zone Bridgman furnace for 12 h for a complete melting of the polycrystalline raw material. The ampoule was subsequently translated from the hot zone to the cold zone at a speed of 1.0 mm/h. In order to generate a temperature gradient of 19° C./cm, the temperature of the cold zone was set at 150° C. After crystal growth, the ingot was annealed in-situ at 150° C. for 48 h in the Bridgman furnace without translation. Finally, the ingot was cooled down to room temperature for 24 h to avoid cracks due to thermal stress.

Crystal Processing and Characterization. The Boule was cut along the direction perpendicular to the growth direction by using a Struers Accutom-50 waferizing saw with a 300 μm wide diamond-impregnated blade. One wafer was extracted from the middle section of the ingot. Subsequently, the wafer was polished with silicon carbide sand paper and alumina slurries with a particle size of 0.05-1 μm. After fine polishing, no further surface etching or passivation was performed on the polished surface. In order to analyze the phase purity of the as-grown crystal, the powder X-ray diffraction (PXRD) pattern of the ground crystals was collected using an Si-calibrated Rigaku Miniflex 600 diffractometer operating at 40 kV and 15 mA (Cu Kα radiation λ=1.5406 Å). The XRD powder pattern was refined using the Jana2006 software suite. (See, e.g., Petricek, V., et al., Crystallographic computing system JANA2006: General features. *Z. Krist-Cryst. Mater.* 229, 345-352 (2014).)

Single Crystal X-ray diffraction. Single-crystal X-ray diffraction was performed at 298(2) K with a Stoe image plate diffraction system (IPDS) II diffractometer using graphite-monochromated Mo Kα radiation (λ=0.71073 Å). Data reduction and numerical absorption corrections were done on the structures using Stoe X-Area software. Structures were solved by direct methods and refined by full-matrix least-squares on $F^2$ (all data) using the Jana2006 software suite. Thermal displacement parameters were refined anisotropically for all atomic positions.

Optical Properties Measurements. Solid-state diffusion reflectance UV-vis-NIR spectroscopy was performed with a Shimadzu UV-3600PC double-beam, double-monochromator spectrophotometer operating in the 300-2500 nm region, using $BaSO_4$ as a 100% reflecting reference.

Thermal Analysis. To assess the thermal stability of $Cu_2I_2Se_6$, differential thermal analysis (DTA) was performed using a Netzsch STA 449F3 Jupiter thermal analyzer. Ground crystalline material (~50 mg) was flame sealed in a silica ampoule evacuated to $10^{-4}$ mbar. As a reference, a similarly sealed ampoule of ~30 mg of $Al_2O_3$ was used. The sample was heated to 650° C. at 10° C./min and then cooled at −10° C./min to 20° C. The sample was cycled for a second time at 10° C./min to 650° C. and then cooled at −10° C./min to 70° C.

Band Structure Calculations. In order to investigate the electronic structure of $Cu_2I_2Se_6$, first-principles calculations were carried out within the density functional theory formalism using the Projector Augmented Wave method implemented in the Vienna Ab-initio Simulation Package. (See, e.g., Blochl, P. E., Projector augmented-wave method. *Phys. Rev. B* 50, 17953-17979 (1994); Kresse, G., et al., Efficient iterative schemes for ab initio total-energy calculations using a plane-wave basis set. *Phys. Rev. B* 54, 11169-11186 (1996); and Kresse, G., et al., Ab-initio molecular-dynamics simulation of the liquid-metal amorphous-semiconductor transition in germanium. *Phys. Rev. B* 49, 14251-14269 (1994).) The energy cut-off for plane wave basis was set to 350 eV, and the Monkhorst-Pack k-point grid of 5×5×5 was used for Brillouin zone (BZ) sampling. For exchange-correlation function, the generalized gradient approximation (GGA) was employed within Perdew-Burke-Ernzerhof (PBE) formalism. (See, e.g., Perdew, J. P., et al., Generalized gradient approximation made simple (vol 77, pg 3865, 1996). *Phys. Rev. Lett.* 78, 1396-1396 (1997).) To obtain the ground states for each compound, the crystal structures, the lattice parameters, and the positions of atoms in the cells were relaxed until the atomic forces on each atom were less than 0.01 eV/Å. The hole and electron effective mass components were obtained as the inverse of the eigenvalues of the tensor of second derivatives of the band dispersions calculated numerically using the finite difference method for valence band maximum and conduction band minimum bands, respectively.

Device fabrication and X-ray Photocurrent Measurements. The sample was mounted on 1-square inch glass substrate. The contacts were fabricated by applying colloidal fast-dry carbon paint on the parallel surfaces of the wafer. The diameter of the electrode on the top of the sample was around 2 mm. Cu wires were attached to the contacts made by carbon paint, and then attached to Cu foil attached to the glass substrate. The thickness of the device was around 1.0 mm, and the diameter of the wafer was 10 mm. The DC I-V measurements under dark were performed. DC conductivity was measured using a Keithley 6517B electrometer and a Keithley 6105 resistivity adapter. Electromagnetic interface and photoconductive responses were eliminated by an enclosure. Photocurrent measurements were performed using a 22 keV Ag X-ray as an irradiation source. Ag X-ray was generated from an Si-calibrated CPS 120 INEL diffractometer operating at 40 kV and 2 mA.

Hard radiation spectroscopy measurements. An un-collimated [241]Am alpha was used to characterize the detector radiation response upon 5.5 MeV alpha particles. The activity of the alpha source was around 1.0 µCi. The measurements were also carried out in the atmosphere with a source-detector distance of ~2 mm. The fabricated device was connected to an eV-550 preamplifier box. Various bias voltages from 100 to 300 V were applied. For the single carrier measurement, the cathode on the top of the wafer was placed under hard irradiation to make sure that the measured signal was induced by electron drift through the whole thickness of material. The signals were transferred to an ORTEC amplifier (Model 572A) with a linear amplifier gain of 50, amplifier shaping time of 2.0 µs, and collection time of 300 s, before they were evaluated by a dual 16 K input multichannel analyzer (Model ASPEC-927) and read into the MAESTRO-32 software. For carrier mobility measurements, the complete transient waveforms from the preamplifier with a maximum time resolution of 4 ns were recorded by using a homemade interface based on National Instruments software. Every transient waveform was analyzed to determine the rise time corresponding to the transit time between 10% and 90% of the amplitude of the transient pulses.

TABLE 1

Crystal data and structure refinement for $Cu_2I_2Se_6$ at 293K.

| | |
|---|---|
| Empirical formula | $Cu_2I_2Se_6$ |
| Formula weight | 854.7 |
| Temperature | 293K |
| Wavelength | 0.71073 Å |
| Crystal system | trigonal |
| Space group | R -3 m |
| Unit cell dimensions | a = 14.0392(9) Å, α = 90° |
| | b = 14.0392(9) Å, β = 90° |
| | c = 14.1531(10) Å, γ = 120° |
| Volume | 2415.8(3) Å$^3$ |
| Z | 9 |
| Density (calculated) | 5.2871 g/cm$^3$ |
| Absorption coefficient | 29.982 mm$^{-1}$ |
| F(000) | 3312 |
| Crystal size | 0.0786 × 0.0476 × 0.0243 mm$^3$ |
| θ range for data collection | 2.9 to 29.13° |
| Index ranges | -19 <= h <= 19, -16 <= k <= 17, -19 <= l <= 19 |
| Reflections collected | 7221 |
| Independent reflections | 807 [$R_{int}$ = 0.0432] |
| Completeness to θ = 29.13° | 100% |
| Refinement method | Full-matrix least-squares on F$^2$ |
| Data/restraints/parameters | 807/0/32 |
| Goodness-of-fit | 1.78 |
| Final R indices [I > 2σ(I)] | $R_{obs}$ = 0.0244, $wR_{obs}$ = 0.0493 |
| R indices [all data] | $R_{all}$ = 0.0263, $wR_{all}$ = 0.0496 |
| Extinction coefficient | 140 |
| Largest diff peak and hole | 1.13 and -0.96 e · Å$^{-3}$ |

$R = \Sigma||F_o| - |F_c||/\Sigma|F_o|$, $wR = \{\Sigma[w(|F_o|^2 - |F_c|^2)^2]/\Sigma[w(|F_o|^4)]\}^{1/2}$ and $w = 1/(\sigma^2(I) + 0.0004I^2)$

TABLE 2

Atomic coordinates (×10$^4$) and equivalent isotropic displacement parameters (Å$^2$ × 10$^3$) for $Cu_2I_2Se_6$ at 293K with estimated standard deviations in parentheses.

| Label | x | y | z | Occupancy | $U_{eq}$* |
|---|---|---|---|---|---|
| I(1) | 3333.33 | 136(1) | 1666.67 | 1 | 21(1) |
| Se(1) | 4952(1) | 2476(1) | 3740(1) | 1 | 16(1) |
| Se(2) | 1713(1) | 856(1) | 3819(1) | 1 | 18(1) |
| Se(3) | 5795(1) | 4205(1) | 272(1) | 1 | 22(1) |
| Cu(1) | 3291(1) | 1646(1) | 2743(1) | 1 | 27(1) |

*$U_{eq}$ is defined as one third of the trace of the orthogonalized $U_{ij}$ tensor.

TABLE 3

Anisotropic displacement parameters (Å$^2$ × 10$^3$) for $Cu_2I_2Se_6$ at 293K with estimated standard deviations in parentheses.

| Label | $U_{11}$ | $U_{22}$ | $U_{33}$ | $U_{12}$ | $U_{13}$ | $U_{23}$ |
|---|---|---|---|---|---|---|
| I(1) | 22(1) | 19(1) | 22(1) | 11(1) | -3(1) | -1(1) |
| Se(1) | 14(1) | 15(1) | 18(1) | 7(1) | 1(1) | 0(1) |
| Se(2) | 16(1) | 18(1) | 20(1) | 8(1) | -1(1) | 0(1) |
| Se(3) | 19(1) | 19(1) | 26(1) | 9(1) | 2(1) | -2(1) |
| Cu(1) | 23(1) | 26(1) | 31(1) | 11(1) | 0(1) | 0(1) |

The anisotropic displacement factor exponent takes the form: $-2\pi^2[h^2a^{*2}U_{11} + \ldots + 2hka^* b^* U_{12}]$.

Example 2

Solid Solutions of $Cu_2I_2Se_6$

This example described methods by with solid solutions of $Cu_2I_2Se_6$ can be synthesized.

A solid solution of $Cu_2I_xBr_{2-x}Se_yTe_{6-y}$ can be made by: (1) the binary precursors including CuI, CuBr, $Cu_2Se$ and $Cu_2Te$ with an appropriate stoichiometry or; (2) the elementary precursors including Cu, $I_2$, $Br_2$, Se and Te with an appropriate stoichiometry. All the precursors are put into a silica ampoule sealed under vacuum pumping, and then heated at the temperature range of 400-700° C. for at least 10 hours in a rocking furnace or tube furnace to ensure complete chemical reaction. The final solid solution is obtained when the ampoule cools down to any temperature under 100° C.

A solid solution of $Cu_2I_xBr_{2-x}Se_yS_{6-y}$ can be made using the same processes, using the corresponding binary (e.g., CuI, CuBr, $Cu_2Se$ and $Cu_2S$) or elementary (e.g., Cu, $I_2$, $Br_2$, Se and S) precursors.

Additional details regarding methods for forming Boules from melts of the materials using a vertical Bridgman method and for processing the Boules can be found in Example 1.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method for detecting incident radiation, the method comprising:
   exposing a material comprising a metal inorganic framework having the formula $Cu_2I_2Se_6$ to incident radiation comprising gamma radiation, x-ray radiation, alpha particle radiation, or a combination of two or more thereof, wherein the material absorbs the incident radiation and electron-hole pairs are generated in the material; and
   measuring at least one of the energy and intensity of the absorbed incident radiation by detecting the generated electrons, holes, or both.

2. A method for detecting incident radiation, the method comprising:
   exposing a material comprising a metal inorganic framework, wherein the metal inorganic framework is a solid solution having the formula $Cu_2I_xBr_{2-x}Se_yTe_{6-y}$ or $Cu_2I_xBr_{2-x}Se_yS_{6-y}$, where $0 \leq x \leq 1$ and $0 \leq y \leq 3$, to incident radiation comprising gamma radiation, x-ray radiation, alpha particle radiation, or a combination of two or more thereof, wherein the material absorbs the incident radiation and electron-hole pairs are generated in the material; and
   measuring at least one of the energy and intensity of the absorbed incident radiation by detecting the generated electrons, holes, or both.

3. The method of claim 1, wherein the metal inorganic framework is a single crystal of $Cu_2I_2Se_6$ having a diameter of at least 1 cm.

4. The method of claim 3, wherein the single crystal of $Cu_2I_2Se_6$ has a resistivity of at least $10^{12}$ Ω·cm.

5. The method of claim 1, wherein the incident radiation comprises x-ray radiation.

6. The method of claim 1, wherein the incident radiation comprises alpha particle radiation.

7. A device for the detection of incident radiation comprising:
   a material comprising a metal inorganic framework having the formula $Cu_2I_2Se_6$;
   a first electrode in electrical communication with the material;
   a second electrode in electrical communication with the material, wherein
   the first and second electrodes are configured to apply an electric field across the material; and
   a detector configured to measure a signal generated by electron-hole pairs that are formed when the material is exposed to incident gamma radiation, x-ray radiation, alpha particle radiation, or a combination of two or more thereof.

8. A device for the detection of incident radiation comprising:
   a material comprising a metal inorganic framework, wherein the metal inorganic framework is a solid solution having the formula $Cu_2I_xBr_{2-x}Se_yTe_{6-y}$ or $Cu_2I_xBr_{2-x}Se_yS_{6-y}$, where $0 \leq x \leq 1$ and $0 \leq y \leq 3$;
   a first electrode in electrical communication with the material;
   a second electrode in electrical communication with the material, wherein
   the first and second electrodes are configured to apply an electric field across the material; and
   a detector configured to measure a signal generated by electron-hole pairs that are formed when the material is exposed to incident gamma radiation, x-ray radiation, alpha particle radiation, or a combination of two or more thereof.

9. The device of claim 7, wherein the metal inorganic framework is a single crystal of $Cu_2I_2Se_6$ having a diameter of at least 1 cm.

10. The device of claim 9, wherein the single crystal of $Cu_2I_2Se_6$ has a resistivity of at least $10^{12}$ Ω·cm.

11. The device of claim 7, having an electron mobility greater than 35 cm$^2$ V$^{-1}$ s$^{-1}$.

12. A photovoltaic cell comprising:
   (a) a first electrode comprising an electrically conductive material;
   (b) a second electrode comprising an electrically conductive material;
   (c) a photoactive material disposed between, and in electrical communication with, the first and second electrodes, the photoactive material comprising a metal inorganic framework having the formula $Cu_2I_2Se_6$; and
   (d) a hole transporting material disposed between the first and second electrodes and configured to facilitate the transport of holes generated in the photoactive material to one of the first and second electrodes.

13. A photovoltaic cell comprising:
   (a) a first electrode comprising an electrically conductive material;
   (b) a second electrode comprising an electrically conductive material;
   (c) a photoactive material disposed between, and in electrical communication with, the first and second electrodes, the photoactive material comprising a metal inorganic framework, wherein the metal inorganic framework is a solid solution having the formula $Cu_2I_xBr_{2-x}Se_yTe_{6-y}$ or $Cu_2I_xBr_{2-x}Se_yS_{6-y}$, where $0 \leq x \leq 1$ and $0 \leq y \leq 3$; and
   (d) a hole transporting material disposed between the first and second electrodes and configured to facilitate the transport of holes generated in the photoactive material to one of the first and second electrodes.

14. A method for operating the photovoltaic cell of claim 12, comprising:
   exposing the photoactive material to incident solar radiation, wherein the photoactive material absorbs the incident solar radiation and a photocurrent is produced.

* * * * *